(12) United States Patent
Zhou et al.

(10) Patent No.: US 12,490,517 B2
(45) Date of Patent: Dec. 2, 2025

(54) MANUFACTURING METHOD FOR DISPLAY PANEL, DISPLAY PANEL AND DISPLAY DEVICE

(71) Applicant: HKC CORPORATION LIMITED, Shenzhen (CN)

(72) Inventors: Mancheng Zhou, Shenzhen (CN); Baohong Kang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 369 days.

(21) Appl. No.: 18/359,590

(22) Filed: Jul. 26, 2023

(65) Prior Publication Data

US 2024/0313003 A1 Sep. 19, 2024

(30) Foreign Application Priority Data

Mar. 14, 2023 (CN) .......................... 202310285080.9

(51) Int. Cl.
| | |
|---|---|
| *H01L 27/24* | (2006.01) |
| *H01L 25/18* | (2023.01) |
| *H10D 86/01* | (2025.01) |
| *H10D 86/40* | (2025.01) |
| *H10D 86/60* | (2025.01) |

(52) U.S. Cl.
CPC ............ *H10D 86/60* (2025.01); *H01L 25/18* (2013.01); *H10D 86/021* (2025.01); *H10D 86/441* (2025.01)

(58) Field of Classification Search
CPC ...... H10D 86/60; H10D 86/021; H10D 86/01; H10D 86/441; H10D 86/40; H01L 25/18; H01L 25/167; G02F 1/1309; G02F 1/13; G02F 1/1343; G02F 1/1368; G02F 1/167; G02F 2203/69; G02F 2203/02; G09G 3/00; G09G 3/006; G09G 3/3208; G09G 3/3233; G09G 3/20; G09G 2310/0202; G09G 2310/0267; G09G 2310/08; G01R 31/2635; G01R 31/44
See application file for complete search history.

(56) References Cited

U.S. PATENT DOCUMENTS

| | | | |
|---|---|---|---|
| 9,954,389 B2 * | 4/2018 | Yoshitani | H02J 50/20 |
| 10,453,368 B2 * | 10/2019 | Lin | G09G 3/3266 |
| 11,372,302 B2 * | 6/2022 | Wu | G02F 1/136222 |
| 11,532,682 B2 * | 12/2022 | Han | H10D 86/451 |

(Continued)

*Primary Examiner* — Nikolay K Yushin
(74) *Attorney, Agent, or Firm* — Hodgson Russ LLP

(57) ABSTRACT

A manufacturing method includes: providing a substrate; forming, in a display area of the substrate, a plurality of lines of scan lines, a plurality of rows of data lines and a plurality of display assemblies; forming, at the periphery of the display area, a sense line including a first sensing section connected to each of the scan lines, a switch assembly and a second sensing section connected in sequence and connected to each of the data lines; inputting a shut-off signal to a control terminal of the switch assembly; inputting a scanning signal to each of the scan lines through the first sensing section and inputting a data signal to each of the data lines through the second sensing section; and disconnecting the scan lines from the first sensing section and disconnecting the data lines from the second sensing section when confirming that each display assemblies is lighted up.

20 Claims, 4 Drawing Sheets

(56) References Cited

U.S. PATENT DOCUMENTS

| | | | |
|---|---|---|---|
| 11,605,323 B2* | 3/2023 | Han | H10K 59/40 |
| 2016/0097501 A1* | 4/2016 | Yoshitani | H02J 50/20 |
| | | | 362/183 |
| 2019/0139471 A1* | 5/2019 | Lin | G09G 3/3275 |
| 2021/0104588 A1* | 4/2021 | Han | H10K 59/1213 |
| 2022/0122499 A1* | 4/2022 | Han | H10K 59/40 |
| 2022/0171225 A1* | 6/2022 | Wu | G06V 40/1318 |

* cited by examiner

MANUFACTURING METHOD FOR DISPLAY PANEL, DISPLAY PANEL AND DISPLAY DEVICE

CROSS-REFERENCE TO RELATED APPLICATION

This application claims priority to Chinese Patent Application No. 202310285080.9, filed on Mar. 14, 2023, the entire disclosure of which is incorporated herein by reference.

TECHNICAL FIELD

The present disclosure belongs to the field of display technology, and particularly relates to a manufacturing method for a display panel, the display panel and a display device.

BACKGROUND

Display panels include liquid crystal display (LCD) panels and organic light emitting diode (OLED) display panels and the like. In a manufacturing process of the display panel, a plurality of testing procedures are carried out. An important testing procedure is a lighting test on the cut display panel, so as to detect whether the display panel has problems of dark spots and the like. During the lighting test, a scanning signal is outputted to shorting bars connected to all scan lines, switching transistors of sub-pixels connected to all scan lines are switched on, and then a data signal is outputted to the shorting bars of all the scan lines so as to write data, so that all the sub-pixels are lighted up.

The shorting bars connected to the scan lines and the shorting bars connected to the data lines are arranged in a side area of the display panel. In addition, a sense line further arranged in the side area of the display panel, and the sense line surrounds the display panel and is configured to detect whether the display panel is broken.

SUMMARY

There are provided a manufacturing method for a display panel, the display panel and a display device, according to embodiments of the present disclosure. The technical solution is as below:

According to one aspect of the present disclosure, there is provided a manufacturing method for a display panel. The manufacturing method for a display panel includes:
  providing a substrate, wherein the substrate includes a display area and a non-display area arranged around the display area, the non-display area includes a binding area located on one side of the display area and sensing areas around the remaining sides of the display area, and the binding area is configured to bind a driving chip;
  forming, in the display area, a plurality of lines of scan lines, a plurality of rows of data lines and a plurality of display assemblies, wherein the display area is located at intersections of the scan lines and the data lines; forming a sense line in the sensing area, wherein the sense line is arranged around the remaining sides of the display area and comprises a first sensing section, a second sensing section and a switch assembly; the first sensing section is connected to each of the scan lines, and the second sensing section is connected to each of the data lines; the switch assembly is provided with a control terminal, a first terminal and a second terminal, one end of the first sensing section is connected to the first terminal of the switch assembly and the other end of the first sensing section is configured to be connected to the driving chip, and one end of the second sensing section is connected to the second terminal of the switch assembly and the other end of the second sensing section is configured to be connected to the driving chip;
  inputting a shut-off signal to the control terminal of the switch assembly, so that the first end and the second end of the switch assembly are in an off state;
  inputting a scanning signal to each of the scan lines through the first sensing section and inputting a data signal to each of the data lines through the second sensing section; and
  disconnecting the scan lines from the first sensing section and disconnecting the data lines from the second sensing section when it is confirmed that a working state of each of the display assemblies satisfies a predetermined condition.

According to a second aspect of the present disclosure, there is provided a display panel, made by the manufacturing method for a display panel, wherein the display panel includes a substrate; the substrate comprises a display area and a non-display area arranged around the display area, the non-display area includes a binding area located on one side of the display area and sensing areas around the remaining sides of the display area, and the binding area is configured to bind a driving chip;
  the display panel further includes a plurality of lines of scan lines, a plurality of rows of data lines, a plurality of display assemblies and a sense line, wherein the plurality of lines of scan lines and the plurality of rows of data lines are arranged in the display area; the display area is located at intersections of the scan lines and the data lines; the sense line is located in the sensing area, is arranged around the remaining sides of the display area, and includes a first sensing section, a second sensing section and a switch assembly; the first sensing section is further configured to be connected to each of the scan lines, and the second sensing section is further configured to be connected to each of the data lines; the switch assembly is provided with a control terminal, a first terminal and a second terminal, one end of the first sensing section is connected to the first terminal of the switch assembly and the other end of the first sensing section is configured to be connected to the driving chip, and one end of the second sensing section is connected to the second terminal of the switch assembly and the other end of the second sensing section is configured to be connected to the driving chip.

According to a third aspect of the present disclosure, there is provided a display device, including:
  the display panel; and
  a driving chip arranged in the binding area of the display panel, wherein the driving chip is connected to the first sensing section and the second sensing section.

Other features and advantages of the present disclosure will become apparent from the following detailed description or will be acquired in part through the practice of the present disclosure.

It should be understood that the above general description and the following detailed description are only illustrative and explanatory, and cannot limit the present disclosure.

BRIEF DESCRIPTION OF DRAWINGS

The drawings, which are incorporated in and constitute a part of this specification, illustrate embodiments consistent with the present disclosure and, together with the description, serve to explain the principles of the present disclosure. It is apparent that the drawings described below are merely some embodiments of the present disclosure, and those of ordinary skill in the art further can obtain other drawings according to those drawings without making creative efforts.

DETAILED DESCRIPTION

The exemplary embodiment will be described more comprehensively with reference to drawings. However, the exemplary embodiment can be implemented in various forms and shall not be construed as example to the described embodiment. On the contrary, the embodiments are provided to make the present disclosure more comprehensive and integral and the concept of the exemplary embodiment is comprehensively transferred to those skilled in the art.

In addition, features, structures or characteristics described herein may be combined in one or more embodiments freely as appropriate. In the description below, many specific details are provided, so that the embodiments of the present disclosure are fully understood. However, those skilled in the art will realize that the technical solution of the present disclosure can be practiced without one or more of specific details or other methods, components, devices, steps and the like can be used. In other cases, known methods, devices, implementations or operations are not illustrated or described in detail to prevent obscuring all aspects of the present disclosure.

The present disclosure will be further described in detail below in combination with the drawings and the specific embodiments. It is to be noted herein that technical features involved in the described embodiments of the present disclosure can be combined with one another as long as they do not conflict with each other. The embodiments described with reference to the drawings below are exemplary, and are merely used for explaining the present disclosure and are not construed as limitation to the present disclosure.

Embodiment I

Figure 1:
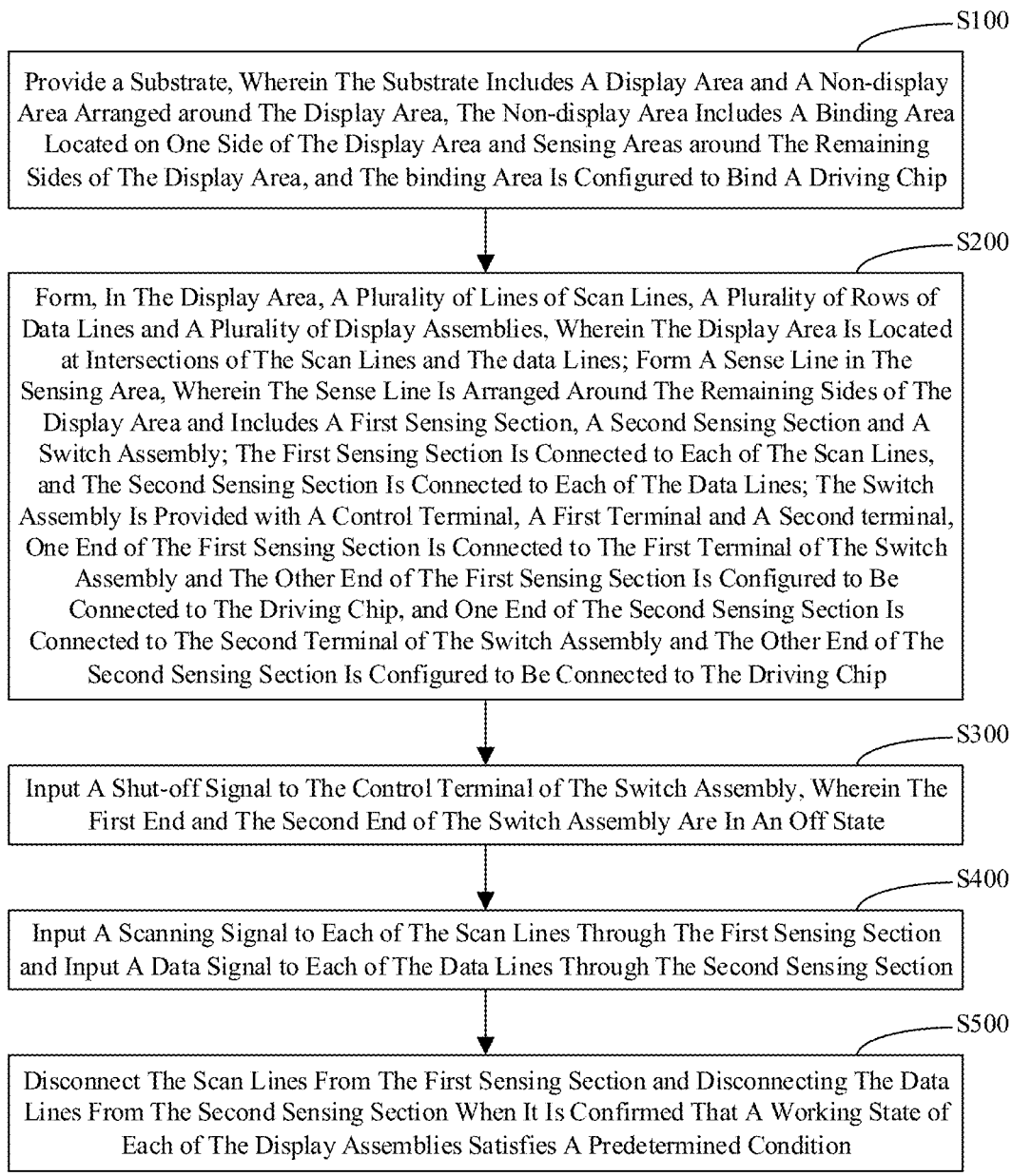
FIG. 1 is a flow diagram of a manufacturing method for a display panel in the embodiment I of the present disclosure.
Figure 2:
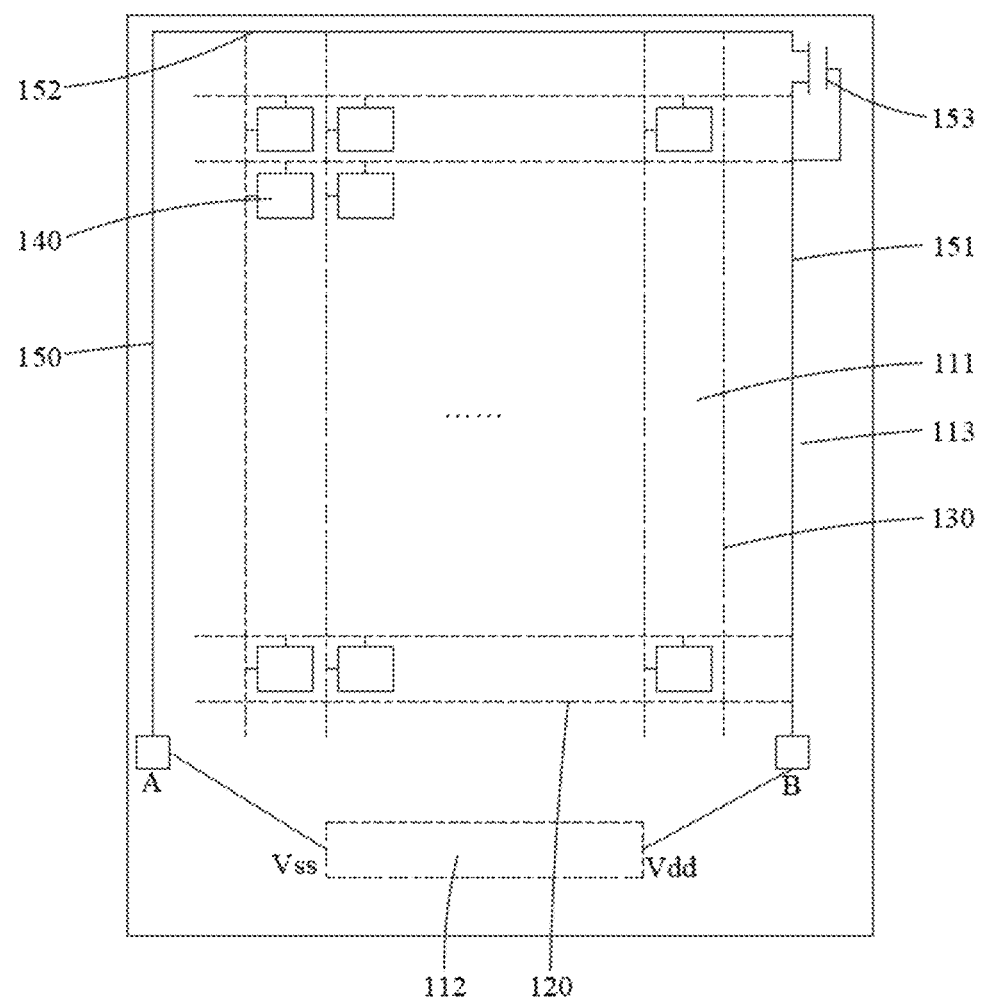
FIG. 2 is a schematic diagram of manufacturing the display panel in the embodiment I of the present disclosure.

As shown in FIG. 1 and FIG. 2, the manufacturing method for a display panel in the embodiment includes:

S100: a substrate is provided, wherein the substrate includes a display area 111 and a non-display area 111 arranged around the display area 111, the non-display area 111 includes a binding area 112 located on one side of the display area 111 and sensing areas 113 around the remaining sides of the display area 111, and the binding area 112 is configured to bind a driving chip 200;

S200: a plurality of lines of scan lines 120, a plurality of rows of data lines 130 and a plurality of display assemblies 140 are formed in the display area 111, wherein the display assemblies 140 are located at intersections of the scan lines 120 and the data lines 130; a sense line 150 is formed in the sensing area 113, wherein the sense line 150 is arranged around the remaining sides of the display area 111 and includes a first sensing section 151, a second sensing section 152 and a switch assembly 153; the first sensing section 151 is connected to each of the scan lines 120, and the second sensing section 152 is connected to each of the data lines 130; the switch assembly 153 is provided with a control terminal, a first terminal and a second terminal, one end of the first sensing section 151 is connected to the first terminal of the switch assembly 153 and the other end of the first sensing section 151 is configured to be connected to the driving chip 200, and one end of the second sensing section 152 is connected to the second terminal of the switch assembly 153 and the other end of the second sensing section 152 is configured to be connected to the driving chip 200;

S300: a shut-off signal is inputted to the control terminal of the switch assembly 153, so that the first terminal and the second terminal of the switch assembly 153 are in an off state;

S400: a scanning signal is inputted to each of the scan lines 120 through the first sensing section 151 and a data signal is inputted to each of the data lines 130 through the second sensing section 152; and S500: the scan lines 120 are disconnected from the first sensing section 151 and the data lines 130 are disconnected from the second sensing section 152 when it is confirmed that a working state of each of the display assemblies 140 satisfies a predetermined condition.

In a manufacturing process of the display panel 100, a lighting test is performed, so as to detect whether the display panel 100 has problems of dark spots and the like. Before the lighting test is performed, the first sensing section 151 is connected to all the scan lines 120 and the second sensing section 152 is connected to all the data lines 130.

When the lighting test is performed, the shut-off signal is inputted to the control terminal of the switch assembly 153 first, so that the first terminal and the second terminal of the switch assembly 153 are in the off-state, so as to prevent mutual interference between the inputted scanning signal and data signal; then the scanning signal is inputted to each of the scan lines 120 through the first sensing section 151, and the transistor connected to the scan line 120 in the display assembly 140 is switched on, so that the data signal inputted by the second sensing section 152 can be written into the display assembly 140, so as to drive the display assembly 140 to emit light; then the scan lines 120 are disconnected from the first sensing section 151 and the data lines 130 are disconnected from the second sensing section 152 when it is confirmed that a working state of each of the display assemblies 140 satisfies the predetermined condition, i.e., all the display assemblies 140 are lighted to complete manufacturing of the display panel 100.

In addition, the end of the first sensing section 151 away from the switch assembly 153 is configured to be connected to the driving chip 200, the end of the second sensing section 152 away from the switch assembly 153 is further configured to be connected to the driving chip 200, the switch assembly 153 is switched off after the scan line 120 is disconnected from the first sensing section 151 and the data line 130 is disconnected from the second sensing section 152, and the sense line 150 can be configured to detect whether the display panel 100 is broken.

In the embodiment, the substrate includes the display area 111, the binding area 112 and the sensing area 113. The plurality of lines of scan lines 120, the plurality of rows of data lines 130 and the plurality of display assemblies 140 are formed in the display area 111; the sense line 150 is formed in the sensing area 113 and includes the first sensing section 151, the second sensing section 152 and the switch assembly 153; the first sensing section 151 is connected to each of the scan lines 120, the second sensing section 152 is connected to each of the data lines 130, the switch assembly 153 is connected to the first sensing section 151 and the second sensing section 152; the first sensing section 151 and the second sensing section 152 are further connected to the driving chip 200; the switch assembly 153 is switched off, the scanning signal is inputted to each of the scan lines 120 through the first sensing section 151, the data signal is inputted to each of the data lines 130 through the second sensing section 152 for a lighting test, the switch assembly 153 is switched off after the scan line 120 is disconnected from the first sensing section 151 and the data line 130 is disconnected from the second sensing section 152, and the sense line 150 can be configured to detect whether the display panel 100 is broken. In the embodiment, the sense lines 150 are reused as shorting bars, and a part of or all of the shorting bars of the display panel 100 can be canceled, such that the design space of the display panel 100 occupied by the shorting bars and the sense lines 150 is reduced, and a frame of the display panel 100 can be designed narrower.

As shown in FIG. 1 and FIG. 2, the control terminal of the switch assembly 153 is connected to the first sensing section 151, and the first sensing section 151 inputs the shut-off signal to the control terminal of the switch assembly 153 while inputting the scanning signal to each of the scan lines 120.

In addition, when the sense line 150 is configured to detect whether the display panel 100 is broken, the driving chip 200 inputs a switch-off signal to the first sensing section 151, the first terminal and the second terminal of the switch assembly 153 are conducted, the sense line 150 and the driving chip form a closed loop, and a current sensing assembly inside the driving chip 200 will sense the current on the sense line 150. When the display panel 100 is not broken, the resistance of the sense line 150 is small, and the current of the sense line 150 is greater than a predetermined value; and when the display panel 100 is broken, the resistance of the sense line 150 increases significantly, and the current of the sense line 150 is smaller than the predetermined value.

The control terminal of the switch assembly 153 is connected to the first sensing section 151, the switch assembly 153 is controlled to be switched off or shut-off through the first sensing section 151 and is not controlled by arranging a signal input terminal at the control terminal control terminal of the switch assembly 153, and the frame of the display panel 100 can be designed narrower.

Exemplarily, as shown in FIG. 1 and FIG. 2, the switch assembly 153 is an N type transistor, a transistor connected to the scan line 120 in the display assembly 140 is a P type transistor, and the scanning signal inputted to the first sensing section 151 is a low level signal.

It is to be noted that the switch assembly 153 can be the N type transistor, and the transistor connected to the scan line 120 in the display assembly 140 can be the P type transistor, but is not limited thereto, the switch assembly 153 can be the P type transistor, and the transistor connected to the scan line 120 in the display assembly 140 can be the N type transistor as appropriate.

When the switch assembly 153 is the N type transistor and the transistor connected to each of the scan lines 120 in the display assembly 140 is the P type transistor, the scanning signal is input to the first sensing section 151, and the scanning signal is the low level signal and controls the switch assembly 153 to shut-off, so as to prevent interference between the inputted scanning signal and data signal. Meanwhile, the transistor connected to each of the scan lines 120 in the display assembly 140 can be switched on through the scanning signal, so that the data signal inputted by the second sensing section 152 can be written into the display assembly 140 so as to drive the display assembly 140 to emit light.

In addition, after the driving chip 200 is bound, the driving chip 200 outputs a high voltage to a connecting node B between the first sensing section 151 and the driving chip 200, the driving chip 200 outputs a low voltage to a connecting node A between the second sensing section 152 and the driving chip 200, and the damage of the display panel 100 can be detected through the current on the sense line 150.

As shown in FIG. 1 and FIG. 2, a condition that the switch assembly 153 is the N type transistor and the transistor connected to each of the scan lines 120 in the display assembly 140 is the P type transistor is taken as an example. After the scan lines 120 are disconnected from the first sensing section 151 and the data lines 130 are disconnected from the second sensing section 152, the manufacturing method for the display panel 100 further includes:

the first sensing section 151 is connected to the driving chip 200 terminal to be connected to a power supply high-voltage terminal Vdd, the second sensing section 152 is connected to the driving chip 200 terminal to be connected to a power supply low-voltage terminal Vss, confirming that the first sensing section 151 is connected to the driving chip 200 terminal and the second sensing section 152 is connected to the driving chip 200 terminal for conduction.

the first sensing section 151 is connected to the driving chip 200 terminal to be connected to the power supply high-voltage terminal Vdd, i.e., a node B is connected to the power supply high-voltage terminal Vdd, and the second sensing section 152 is connected to the driving chip 200 terminal to be connected to the power supply low-voltage terminal Vss, i.e., a node A is connected to the power supply low-voltage terminal Vss, confirming that the node B and the node A are conducted. Thus, it is confirmed that the display panel 100 is not damaged, and the driving chip 200 can be bound.

As shown in FIG. 2, during the lighting test, the first sensing section 151 is connected to all the scan lines 120 and the second sensing section 152 is connected to all the data lines 130. In the state, the display panel 100 cannot display normally. The manufacturing method for the display panel 100 further includes: the first sensing section 151 is disconnected from the scan lines 120 and the second sensing section 152 is disconnected from the data lines 130. Specifically, the method for disconnecting the scan line 120 and the first sensing section 151 includes: connecting ends of the scan lines 120 and the first sensing section 151 are fused with laser; and the method for disconnecting the data lines 130 and the second sensing section 152 includes: connecting ends of the data lines 130 and the second sensing section 152 are fused with laser.

In the display panel 100, the scan lines 120 are located in a first metal layer, the data lines 130 are located in a second metal layer, the scan lines 120 and the data lines 130 are located in different structural layers, and membrane layer structures such as flat layers are further usually arranged above the scan lines 120 and the data lines 130. The connecting ends of the scan lines 120 and the data lines 130 and the sense line 150 are fused with laser, so that the structural layers above the scan lines 120 and the data lines 130 can be prevented from being damaged.

Embodiment II

A display panel 100 in the embodiment II is manufactured by the manufacturing method for the display panel 100 in the embodiment I. The display panel 100 can include a liquid crystal display panel 100 and an OLED display panel 100. Specifically, the display panel 100 includes a substrate; the substrate includes a display area 111 and a non-display area 111 arranged around the display area 111, the non-display area 111 includes a binding area 112 located on one side of the display area 111 and sensing areas 113 around the remaining sides of the display area 111, and the binding area 112 is configured to bind a driving chip 200. The sensing areas 113 surround the remaining sides of the display area 111, that is to say, the sensing areas 113 surround the display area 111 on three sides.

The display panel 100 further includes a plurality of lines of scan lines 120, a plurality of rows of data lines 130, a plurality of display assemblies 140 and a sense line 150, where the plurality of lines of scan lines 120 and the plurality of rows of data lines 130 are arranged in the display area 111, and the display assemblies 140 are located intersections of the scan lines 120 and the data lines 130. The sense lines 150 are located in the sensing areas 113 and surround the display area 111 on three sides.

The sense line 150 includes a first sensing section 151, a second sensing section 152 and a switch assembly 153, where the first sensing section 151 can further be used as a shorting bar to be connected to each of the scan lines 120 and the second sensing section 152 can further be used as a shorting bar to be connected to each of the data lines 130. the switch assembly 153 is provided with a control terminal, a first terminal and a second terminal, one end of the first sensing section 151 is connected to the first terminal of the switch assembly 153 and the other end of the first sensing section 151 is configured to be connected to the driving chip 200, i.e., a node B is connected to the driving chip 200, and one end of the second sensing section 152 is connected to the second terminal of the switch assembly 153, i.e., a node A is connected to the driving chip 200, and the other end of the second sensing section 152 is configured to be connected to the driving chip 200.

In the display panel 100, the plurality of lines of scan lines 120 and the plurality of rows of data lines 130 are arranged in the display area 111; the display assemblies 140 are located intersections of the scan lines 120 and the data lines 130; the sense lines 150 are located in the sensing areas 113 and surround the display area 111 on three sides; the sense line 150 includes the first sensing section 151, the second sensing section 152 and a switch assembly 153, where the first sensing section 151 can further be used as the shorting bar to be connected to each of the scan lines 120 and the second sensing section 152 can further be used as the shorting bar to be connected to each of the data lines 130; one end of the first sensing section 151 is connected to the first terminal of the switch assembly 153 and the other end of the first sensing section 151 is configured to be connected to the driving chip 200, and one end of the second sensing section 152 is connected to the second terminal of the switch assembly 153, and the other end of the second sensing section 152 is configured to be connected to the driving chip 200. In the embodiment, the sense lines 150 are reused as shorting bars, and a part of or all of the shorting bars of the display panel 100 can be canceled, such that the design space of the display panel 100 occupied by the shorting bars and the sense lines 150 is reduced, and a frame of the display panel 100 can be designed narrower.

As shown in FIG. 1, the control terminal of the switch assembly 153 is connected to the first sensing section 151, the switch assembly 153 is an N type transistor, and the transistor connected to the scan line 120 in the display assembly 140 is a P type transistor.

It is to be noted that the switch assembly 153 can be the N type transistor, and the transistor connected to the scan line 120 in the display assembly 140 can be the P type transistor, but is not limited thereto, the switch assembly 153 can be the P type transistor, and the transistor connected to the scan line 120 in the display assembly 140 can further be the N type transistor as appropriate.

The control terminal of the switch assembly 153 is connected to the first sensing section 151, the switch assembly 153 is controlled to be switched off or shut-off through the first sensing section 151 and is not controlled by arranging a signal input terminal at the control terminal control terminal of the switch assembly 153, and the frame of the display panel 100 can be designed narrower. When the transistors connected to the scan lines 120 in the switch assembly 153 and the display assembly 140 are respectively the P type transistor and the N type transistor for the lighting test, the scanning signal shuts off the switch assembly 153 and closes the transistor connected to each of the scan lines 120 in the display assembly 140, the scanning signal controls the switch assembly 153 to shut-off, so as to prevent interference between the inputted scanning signal and data signal. Meanwhile, the transistor connected to each of the scan lines 120 in the display assembly 140 can be switched on through the scanning signal, so that the data signal inputted by the second sensing section 152 can be written into the display assembly 140; and when it is detected that the display panel 100 is broken, the driving chip 200 outputs a high voltage to the node B and outputs a low voltage to the node A, and the switch assembly 153 is switched on.

In some embodiments, the first sensing section 151 and the scan lines 120 are arranged in a same layer, and the second sensing section 152 and the data lines 130 are arranged in a same layer. The switch assembly 153 can be the N type transistor. The N type transistor includes a grid electrode G, a source electrode S and a drain electrode D. The control terminal of the switch assembly 153 is the grid electrode G, the first terminal of the switch assembly 153 is the drain electrode D and is connected to the first sensing section 151 through a via hole, and the second terminal of the switch assembly 153 is the source electrode S and is connected to the second sensing section 152.

The first sensing section 151 and the scan lines 120 are arranged in a same layer, and the second sensing section 152 and the data lines 130 are arranged in a same layer. The first sensing section 151 and the scan lines 120 can be manufactured by using a same step. The second sensing section 152 and the data lines 130 can be manufactured by using a same step. Therefore, the manufacturing cost of the display panel 100 is lowered.

It is to be noted that the first sensing section 151 and the scan lines 120 are arranged in a same layer, and the second sensing section 152 and the data lines 130 are arranged in a same layer, which is not limited thereto. The first sensing section 151 and the second sensing section 152 can further be arranged in the same layer with one of the scan lines 120 and the data lines 130 or are located in independent structural layers as appropriate.

Figure 3:
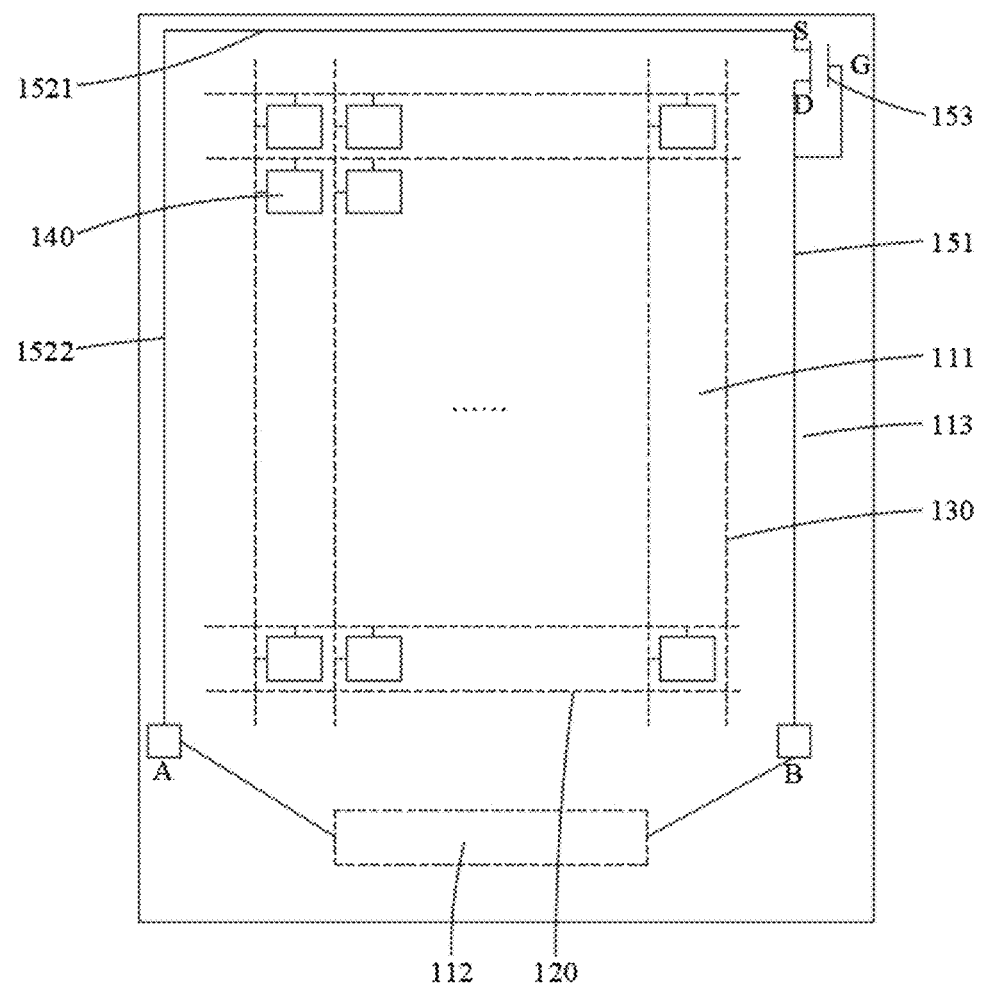
FIG. 3 is a structural schematic diagram of the display panel in the embodiment II of the present disclosure.

In some embodiments, as shown in FIG. 3, the second sensing section 152 includes a transverse connecting section 1521 and a longitudinal connecting section 1522, the transverse connecting section 1521 is located on a side of the display area 111 away from the binding area 112, the longitudinal connecting section 1522 and the first sensing section 151 are located on two opposite sides of the display area 111 in a row direction, an end of the transverse connecting section 1521 away from the longitudinal connecting section 1522 is connected to the second terminal of the switch assembly 153, and an end of the longitudinal connecting section 1522 away from the transverse connecting section 1521 is connected to the driving chip 200. The display panel 100 can further include shorting bars, each of the shoring bars is arranged between the longitudinal connecting section 1522 and a respective adjacent one of the data lines 130, and the shorting bars are configured to be connected to all of the scan lines 120.

The shorting bars and the first sensing section 151 are respectively located on two opposite sides of the display area 111 in the row direction. During the lighting test, both ends of each of the scan lines 120 are respectively connected to the shorting bars and the first sensing section 151. The scan line 120 is driven by the shorting bars and the first sensing section 151 on both sides, which can detect display uniformity of both sides of the display panel 100.

Embodiment III

Figure 4:
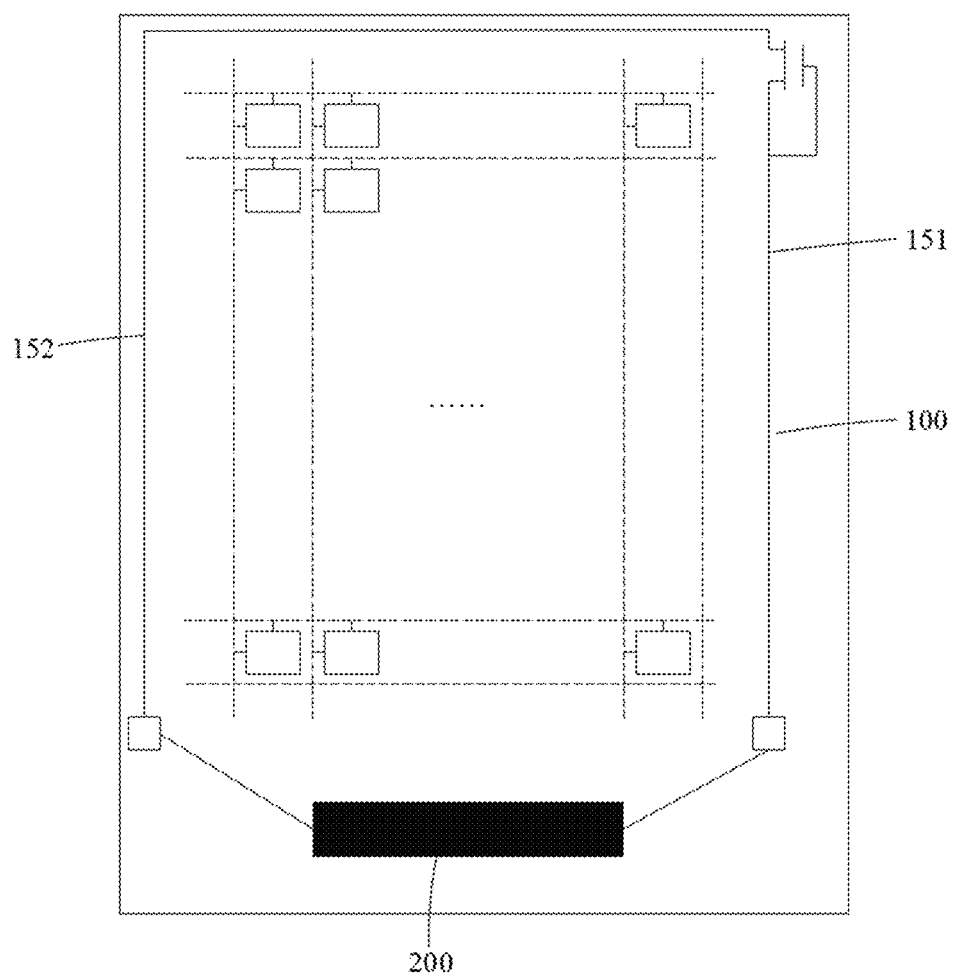
FIG. 4 is a structural schematic diagram of the display panel in the embodiment III of the present disclosure.

As shown in FIG. 4, a display device includes a display panel 100 and a driving chip 200. The display panel 100 includes the display panel 100 disclosed in the embodiment II. The driving chip 200 is arranged in a binding area 112 of the display panel 100, and the driving chip is 200 connected to a first sensing section 151 and a second sensing section 152.

The display device includes the display panel 100. The plurality of lines of scan lines 120 and the plurality of rows of data lines 130 in the display panel 100 are arranged in the display area 111; the display assemblies 140 are located intersections of the scan lines 120 and the data lines 130; the sense lines 150 are located in the sensing areas 113 and surround the display area 111 on three sides; the sense line 150 includes the first sensing section 151, the second sensing section 152 and a switch assembly 153, where the first sensing section 151 can further be used as the shorting bar to be connected to each of the scan lines 120 and the second sensing section 152 can further be used as the shorting bar to be connected to each of the data lines 130; one end of the first sensing section 151 is connected to the first terminal of the switch assembly 153 and the other end of the first sensing section 151 is configured to be connected to the driving chip 200, and one end of the second sensing section 152 is connected to the second terminal of the switch assembly 153, and the other end of the second sensing section 152 is configured to be connected to the driving chip 200. The sense lines 150 are reused as shorting bars, and a part of or all of the shorting bars of the display panel 100 can be canceled, such that the design space of the display panel 100 occupied by the shorting bars and the sense lines 150 is reduced, and a frame of the display panel 100 can be designed narrower.

The terms "first" and "second" are for descriptive purposes only and are not to be construed as indicating or implying their relative importance or implicitly specifying the number of indicated technical features. Thus, features defining 'first', 'second' and the like can expressively or implicitly include one or more features. In the description of the present disclosure, "a plurality of" means two or more, unless expressly specified otherwise.

In the present disclosure, unless otherwise explicitly provided and limited, the terms such as "mount," and "connect," should be understood broadly, which, for example, may refer to a fixed connection, a detachable connection, or an integral connection; which may refer to a mechanical connection or an electrical connection; which may refer to a direct connection or an indirect connection via an intermediate medium; which may also refer to a communication between the insides of two elements. Those skilled in the art can understand specific meaning of the terms in the present disclosure under specific circumstances.

In the description of the specification, the description with reference to the terms "some embodiments", "exemplarily", and the like means that specific features, structures, materials, or features described in connection with the embodiments or examples are included in at least one embodiment or example of the present disclosure. In the description, schematic expressions of the terms do not have to mean same embodiments or exemplary embodiments. Furthermore, specific features, structures, materials or characteristics described can be combined in any one or more embodiments or exemplary embodiments in proper manners. In addition, under a condition without mutual contradiction, those skilled in the art can integrate or combine different embodiments or exemplary embodiments with different embodiments or exemplary embodiments described in the description.

Although the embodiments of the present disclosure have been shown and described above, it can be understood that the embodiments are exemplary and cannot be construed as limitation to the present disclosure. Those of ordinary skill in the art can make changes, modification, replacement and transformation on the embodiments within the scope of the present disclosure. Changes and modifications made according to claims and description of the disclosure shall fall into the scope of the present disclosure.

What is claimed is:

1. A manufacturing method for a display panel, comprising:
providing a substrate, wherein the substrate comprises a display area and a non-display area arranged around the display area, the non-display area comprises a binding area located on one side of the display area and sensing areas around remaining sides of the display area, and the binding area is configured to bind a driving chip;
forming, in the display area, a plurality of lines of scan lines, a plurality of rows of data lines and a plurality of display assemblies, wherein the display area is located at intersections of the scan lines and the data lines;
forming a sense line in the sensing areas, wherein the sense line is arranged around the remaining sides of the display area and comprises a first sensing section, a second sensing section and a switch assembly; wherein the first sensing section is connected to each of the scan lines, and the second sensing section is connected to each of the data lines; wherein the switch assembly is provided with a control terminal, a first terminal and a second terminal, one end of the first sensing section is connected to the first terminal of the switch assembly and the other end of the first sensing section is configured to be connected to the driving chip, and one end of the second sensing section is connected to the second terminal of the switch assembly and the other end of the second sensing section is configured to be connected to the driving chip;

inputting a shut-off signal to the control terminal of the switch assembly, so that the first terminal and the second terminal of the switch assembly are in an off state;

inputting a scanning signal to each of the scan lines through the first sensing section and inputting a data signal to each of the data lines through the second sensing section; and disconnecting the scan lines from the first sensing section and disconnecting the data lines from the second sensing section when it is confirmed that a working state of each of the plurality of display assemblies satisfies a predetermined condition.

2. The manufacturing method for a display panel according to claim 1, wherein a method for disconnecting the scan lines from the first sensing section comprises: fusing connecting ends of the scan lines and the first sensing section with laser; and the method for disconnecting the data lines from the second sensing section comprises: fusing connecting ends of the data lines and the second sensing section with a laser.

3. The manufacturing method for a display panel according to claim 1, wherein the control terminal of the switch assembly is connected to the first sensing section, and the first sensing section inputs the shut-off signal to the control terminal of the switch assembly while inputting the scanning signal to each of the scan lines.

4. The manufacturing method for a display panel according to claim 3, wherein the switch assembly is an N type transistor, a transistor connected to the scan line in the display assembly is a P type transistor, and the scanning signal inputted to the first sensing section is a low level signal; or the switch assembly is the P type transistor, the transistor connected to the scan line in the display assembly is the N type transistor, and the scanning signal inputted to the first sensing section is a high level signal.

5. The manufacturing method for a display panel according to claim 4, wherein the switch assembly is the N type transistor, the transistor connected to the scan line in the display assembly is the P type transistor, and after the scan lines are disconnected from the first sensing section and the data lines are disconnected from the second sensing section, the manufacturing method for the display panel further comprises:

connecting the first sensing section to the driving chip terminal to be connected to a power supply high-voltage terminal, connecting the second sensing section to the driving chip terminal to be connected to a power supply low-voltage terminal, and confirming that the first sensing section is connected to the driving chip terminal and the second sensing section is connected to the driving chip terminal for conduction.

6. A display panel, made by a manufacturing method for a display panel, wherein the display panel comprises a substrate; the substrate comprises a display area and a non-display area arranged around the display area, the non-display area comprises a binding area located on one side of the display area and sensing areas around remaining sides of the display area, and the binding area is configured to bind a driving chip;

the display panel further comprises a plurality of lines of scan lines, a plurality of rows of data lines, a plurality of display assemblies and a sense line, wherein the plurality of lines of scan lines and the plurality of rows of data lines are arranged in the display area; the display area is located at intersections of the scan lines and the data lines; the sense line is located in the sensing areas, is arranged around the remaining sides of the display area, and comprises a first sensing section, a second sensing section and a switch assembly; the first sensing section is further configured to be connected to each of the scan lines, and the second sensing section is further configured to be connected to each of the data lines; the switch assembly is provided with a control terminal, a first terminal and a second terminal, one end of the first sensing section is connected to the first terminal of the switch assembly and the other end of the first sensing section is configured to be connected to the driving chip, and one end of the second sensing section is connected to the second terminal of the switch assembly and the other end of the second sensing section is configured to be connected to the driving chip;

wherein the manufacturing method for a display panel comprises:

providing a substrate, wherein the substrate comprises a display area and a non-display area arranged around the display area, the non-display area comprises a binding area located on one side of the display area and sensing areas around the remaining sides of the display area, and the binding area is configured to bind a driving chip;

forming, in the display area, a plurality of lines of scan lines, a plurality of rows of data lines and a plurality of display assemblies, wherein the display area is located at intersections of the scan lines and the data lines; forming a sense line in the sensing area, wherein the sense line is arranged around the remaining sides of the display area and comprises a first sensing section, a second sensing section and a switch assembly; wherein the first sensing section is connected to each of the scan lines, and the second sensing section is connected to each of the data lines; wherein the switch assembly is provided with a control terminal, a first terminal and a second terminal, one end of the first sensing section is connected to the first terminal of the switch assembly and the other end of the first sensing section is configured to be connected to the driving chip, and one end of the second sensing section is connected to the second terminal of the switch assembly and the other end of the second sensing section is configured to be connected to the driving chip;

inputting a shut-off signal to the control terminal of the switch assembly, so that the first terminal and the second terminal of the switch assembly are in an off state;

inputting a scanning signal to each of the scan lines through the first sensing section and inputting a data signal to each of the data lines through the second sensing section; and disconnecting the scan lines from the first sensing section and disconnecting the data lines from the second sensing section when it is confirmed that a working state of each of the plurality of display assemblies satisfies a predetermined condition.

7. The display panel according to claim 6, wherein the control terminal of the switch assembly is connoted to the first sensing section, the switch assembly is an N type transistor, the transistor connected to the scan line in the display assembly is a P type transistor; or the switch assembly is the P type transistor, and the transistor connected to the scan line in the display assembly is the N type transistor.

8. The display panel according to claim 6, wherein the first sensing section and the scan line are arranged in a same layer, and the second sensing section and the data line are arranged in a same layer.

9. The display panel according to claim 6, wherein the second sensing section comprises a transverse connecting section and a longitudinal connecting section, the transverse connecting section is located on a side of the display area away from the binding area, the longitudinal connecting section and the first sensing section are located on two opposite sides of the display area in a row direction, an end of the transverse connecting section away from the longitudinal connecting section is connected to the second terminal of the switch assembly, and an end of the longitudinal connecting section away from the transverse connecting section is connected to the driving chip; and the display panel further comprises shorting bars, each of the shorting bars is arranged between the longitudinal connecting section and a respective adjacent one of the data lines, and the shorting bars are configured to be connected to all of the scan lines.

10. The display panel according to claim 6, wherein a method for disconnecting the scan lines from the first sensing section comprises: fusing connecting ends of the scan lines and the first sensing section with laser; and the method for disconnecting the data lines from the second sensing section comprises: fusing connecting ends of the data lines and the second sensing section with a laser.

11. The display panel according to claim 6, wherein the control terminal of the switch assembly is connected to the first sensing section, and the first sensing section inputs the shut-off signal to the control terminal of the switch assembly while inputting the scanning signal to each of the scan lines.

12. The display panel according to claim 11, wherein the switch assembly is an N type transistor, a transistor connected to the scan line in the display assembly is a P type transistor, and the scanning signal inputted to the first sensing section is a low level signal; or the switch assembly is the P type transistor, the transistor connected to the scan line in the display assembly is the N type transistor, and the scanning signal inputted to the first sensing section is a high level signal.

13. The display panel according to claim 12, wherein the switch assembly is the N type transistor, the transistor connected to the scan line in the display assembly is the P type transistor, and after the scan lines are disconnected from the first sensing section and the data lines are disconnected from the second sensing section, the manufacturing method for the display panel further comprises:

connecting the first sensing section to the driving chip terminal to be connected to a power supply high-voltage terminal, connecting the second sensing section to the driving chip terminal to be connected to a power supply low-voltage terminal, and confirming that the first sensing section is connected to the driving chip terminal and the second sensing section is connected to the driving chip terminal for conduction.

14. A display device, comprising:
a display panel; and a driving chip arranged in a binding area of the display panel, wherein the driving chip is connected to a first sensing section and a second sensing section;

wherein the display panel, made by a manufacturing method for a display panel, comprises a substrate; the substrate comprises a display area and a non-display area arranged around the display area, the non-display area comprises a binding area located on one side of the display area and sensing areas around remaining sides of the display area, and the binding area is configured to bind the driving chip;

the display panel further comprises a plurality of lines of scan lines, a plurality of rows of data lines, a plurality of display assemblies and a sense line, wherein the plurality of lines of scan lines and the plurality of rows of data lines are arranged in the display area; the display area is located at intersections of the scan lines and the data lines; the sense line is located in the sensing areas, is arranged around the remaining sides of the display area, and comprises a first sensing section, a second sensing section and a switch assembly; the first sensing section is further configured to be connected to each of the scan lines, and the second sensing section is further configured to be connected to each of the data lines; the switch assembly is provided with a control terminal, a first terminal and a second terminal, one end of the first sensing section is connected to the first terminal of the switch assembly and the other end of the first sensing section is configured to be connected to the driving chip, and one end of the second sensing section is connected to the second terminal of the switch assembly and the other end of the second sensing section is configured to be connected to the driving chip;

wherein the manufacturing method for the display panel comprises:

providing a substrate, wherein the substrate comprises a display area and a non-display area arranged around the display area, the non-display area comprises a binding area located on one side of the display area and sensing areas around the remaining sides of the display area, and the binding area is configured to bind a driving chip;

forming, in the display area, a plurality of lines of scan lines, a plurality of rows of data lines and a plurality of display assemblies, wherein the display area is located at intersections of the scan lines and the data lines; forming a sense line in the sensing area, wherein the sense line is arranged around the remaining sides of the display area and comprises a first sensing section, a second sensing section and a switch assembly; wherein the first sensing section is connected to each of the scan lines, and the second sensing section is connected to each of the data lines; wherein the switch assembly is provided with a control terminal, a first terminal and a second terminal, one end of the first sensing section is connected to the first terminal of the switch assembly and the other end of the first sensing section is configured to be connected to the driving chip, and one end of the second sensing section is connected to the second terminal of the switch assembly and the other end of the second sensing section is configured to be connected to the driving chip;

inputting a shut-off signal to the control terminal of the switch assembly, so that the first terminal and the second terminal of the switch assembly are in an off state;

inputting a scanning signal to each of the scan lines through the first sensing section and inputting a data signal to each of the data lines through the second sensing section; and disconnecting the scan lines from the first sensing section and disconnecting the data lines from the second sensing section when it is confirmed that a working state of each of the plurality of display assemblies satisfies a predetermined condition.

15. The display device according to claim 14, wherein the control terminal of the switch assembly is connoted to the first sensing section, the switch assembly is an N type transistor, the transistor connected to the scan line in the display assembly is a P type transistor; or the switch assembly is the P type transistor, and the transistor connected to the scan line in the display assembly is the N type transistor.

16. The display device according to claim 14, wherein the first sensing section and the scan line are arranged in a same layer, and the second sensing section and the data line are arranged in a same layer.

17. The display device according to claim 14, wherein the second sensing section comprises a transverse connecting section and a longitudinal connecting section, the transverse connecting section is located on a side of the display area away from the binding area, the longitudinal connecting section and the first sensing section are located on two opposite sides of the display area in a row direction, an end of the transverse connecting section away from the longitudinal connecting section is connected to the second terminal of the switch assembly, and an end of the longitudinal connecting section away from the transverse connecting section is connected to the driving chip; and the display panel further comprises shorting bars, each of the shorting bars is arranged between the longitudinal connecting section and a respective adjacent one of the data lines, and the shorting bars are configured to be connected to all of the scan lines.

18. The display device according to claim 14, wherein the control terminal of the switch assembly is connected to the first sensing section, and the first sensing section inputs the shut-off signal to the control terminal of the switch assembly while inputting the scanning signal to each of the scan lines.

19. The display device according to claim 18, wherein the switch assembly is an N type transistor, a transistor connected to the scan line in the display assembly is a P type transistor, and the scanning signal inputted to the first sensing section is a low level signal; or the switch assembly is the P type transistor, the transistor connected to the scan line in the display assembly is the N type transistor, and the scanning signal inputted to the first sensing section is a high level signal.

20. The display device according to claim 19, wherein the switch assembly is the N type transistor, the transistor connected to the scan line in the display assembly is the P type transistor, and after the scan lines are disconnected from the first sensing section and the data lines are disconnected from the second sensing section, the manufacturing method for the display panel further comprises:

connecting the first sensing section to the driving chip terminal to be connected to a power supply high-voltage terminal, connecting the second sensing section to the driving chip terminal to be connected to a power supply low-voltage terminal, and confirming that the first sensing section is connected to the driving chip terminal and the second sensing section is connected to the driving chip terminal for conduction.

* * * * *